US 6,723,998 B2

(12) United States Patent
Bisson et al.

(10) Patent No.: US 6,723,998 B2
(45) Date of Patent: Apr. 20, 2004

(54) FARADAY SYSTEM FOR ION IMPLANTERS

(75) Inventors: Jack Bisson, Groveland, MA (US); Zhiyong Zhao, Austin, TX (US); George Gammel, Marblehead, MA (US); Daniel Alvarado, Methuen, MA (US); Craig Walker, Newton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 11 days.

(21) Appl. No.: 09/950,940

(22) Filed: Sep. 12, 2001

(65) Prior Publication Data

US 2002/0070347 A1 Jun. 13, 2002

Related U.S. Application Data

(60) Provisional application No. 60/233,007, filed on Sep. 15, 2000.

(51) Int. Cl.[7] ............................. G01K 1/00; A61N 5/00; H01N 3/08
(52) U.S. Cl. ..................................... 250/397; 250/492.2
(58) Field of Search ............................... 250/492.2, 397

(56) References Cited

U.S. PATENT DOCUMENTS

| 4,011,449 A | 3/1977 | Ko et al. ..................... 250/309 |
| 4,135,097 A | 1/1979 | Forneris et al. ......... 250/492.2 B |
| 4,228,358 A | 10/1980 | Ryding ......................... 250/457 |
| 4,234,797 A | 11/1980 | Ryding ...................... 250/492 B |
| 4,361,762 A | 11/1982 | Douglas .................... 250/492.2 |
| 4,463,255 A | 7/1984 | Robertson et al. ........... 250/291 |
| 4,587,433 A | 5/1986 | Farley ....................... 250/492.2 |
| 4,595,837 A | 6/1986 | Wu et al. ................. 250/492.2 |
| 4,703,256 A * | 10/1987 | Hayafuji ..................... 324/71.3 |
| 4,774,437 A * | 9/1988 | Helmer et al. ........... 315/111.81 |
| 4,786,814 A | 11/1988 | Kolondra et al. ......... 250/492.2 |
| 4,804,837 A | 2/1989 | Farley ......................... 250/251 |
| 4,922,106 A | 5/1990 | Berrian et al. ............ 250/492.2 |
| 4,980,562 A | 12/1990 | Berrian et al. ............ 250/492.2 |
| 5,583,427 A | 12/1996 | Teruya et al. .............. 324/71.3 |
| 5,757,018 A | 5/1998 | Mack et al. ............. 250/492.21 |
| 5,903,002 A * | 5/1999 | Turner et al. ................ 250/281 |
| 6,020,592 A * | 2/2000 | Liebert et al. .......... 250/492.21 |
| 6,452,165 B1 * | 9/2002 | Schwieters ................... 250/283 |

FOREIGN PATENT DOCUMENTS

| DE | 195 11 958 A1 * | 10/1996 | ............ H01J/49/02 |
| DE | 19838553 | 3/2000 | ............ H01J/49/02 |
| JP | 59163745 | 9/1984 | .......... H01J/37/312 |

* cited by examiner

*Primary Examiner*—Stephen Meier
*Assistant Examiner*—Alfred E. Dudding

(57) ABSTRACT

A Faraday system for measuring ion beam current in an ion implanter or other ion beam treatment system includes a Faraday cup body defining a chamber which has an entrance aperture for receiving an ion beam, a suppression electrode positioned in proximity to the entrance aperture to produce electric fields for inhibiting escape of electrons from the chamber, and a magnet assembly positioned to produce magnetic fields for inhibiting escape of electrons from the chamber. The chamber may have a relatively small ratio of chamber depth to entrance aperture width.

17 Claims, 3 Drawing Sheets

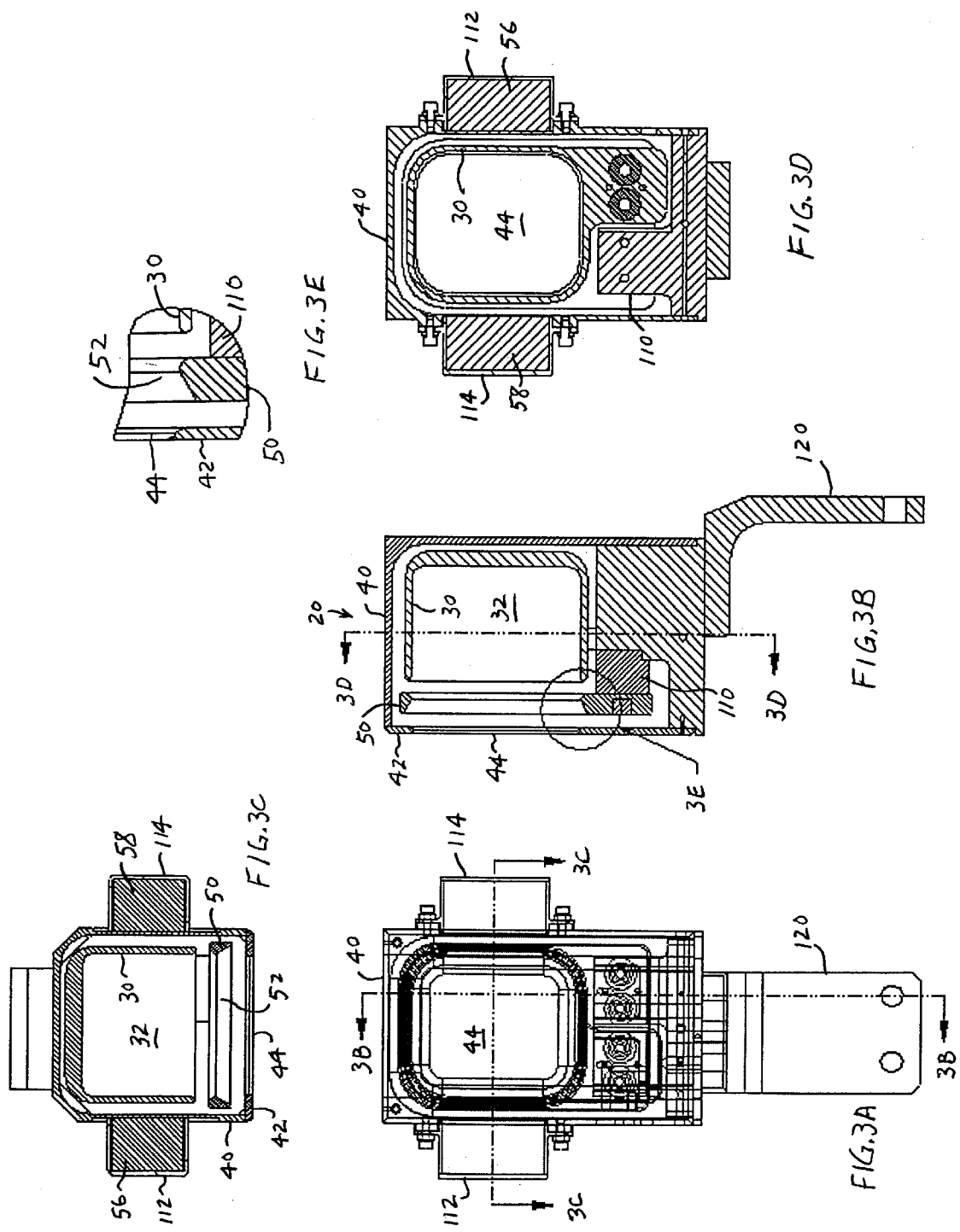

FARADAY SYSTEM FOR ION IMPLANTERS

CROSS-REFERENCE TO RELATED APPLICATION

This application claims the benefit of provisional application Ser. No. 60/233,007 filed Sep. 15, 2000, which is hereby incorporated by reference.

FIELD OF THE INVENTION

This invention relates to systems for ion implantation of workpieces such as semiconductor wafers and, more particularly, to a Faraday system for measuring ion current in an ion implantation system or other ion beam treatment system.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement.

In the operation of an ion implantation system, it is usually necessary to measure the cumulative ion dose implanted in the semiconductor wafer and the dose uniformity over the surface area of the wafer. Typically, ion implants are specified in terms of ion species, ion energy and ion dose. Measurement of ion dose, at least at intervals during an ion implant, is necessary since ion sources typically do not deliver accurate, constant ion beam currents. Semiconductor fabrication processes typically require dose accuracies within 1%.

Cumulative ion dose is typically measured using a Faraday cup, or dose measurement cup, positioned in the vicinity of the target wafer. For example, the Faraday cup may be positioned adjacent to the semiconductor wafer, and the ion beam may be deflected to the Faraday cup at intervals during an ion implant. The Faraday cup may be an electrically conductive cup having an entrance aperture for receiving the ion beam. The ion beam generates in the Faraday cup an electrical current that is representative of ion beam current. The electrical current is supplied to an electronic dose processor, which integrates the current with respect to time to determine the cumulative ion dose. The dose processor may be part of a feedback loop that is used to control the ion implanter. For example, ion implantation may be terminated when a predetermined dose has been reached. The use of Faraday cups to measure dose and dose uniformity in ion implanters is described, for example, in U.S. Pat. No. 4,922,106 issued May 1, 1990 to Berrian et al. and U.S. Pat. No. 4,980,562 issued Dec. 25, 1990 to Berrian et al.

When energetic ions in the ion beam enter the Faraday cup and impinge on surfaces within the Faraday cup, a number of physical processes may occur. These processes include ion scattering, secondary particle emission (electrons, ions, neutrals and photons), surface sputtering and generation of tertiary electrons, which result from secondary particles impacting the cup body walls. A portion of the secondary and tertiary electrons may escape from the Faraday cup through its entrance aperture. Escape of electrons from the Faraday cup produces a measurement error.

One approach to inhibiting the escape of electrons from the Faraday system is the use of an electrostatic suppression electrode positioned at the entrance to the Faraday cup. By negatively charging the electrostatic suppression electrode, the escape of electrons from the Faraday cup is inhibited. A Faraday cage having an electrostatic suppression electrode is disclosed in U.S. Pat. No. 4,135,097 issued Jan. 16, 1979 to Forneris et al. U.S. Pat. No. 4,135,097 discloses an alternate configuration wherein a pair of magnets is used for electron suppression. A magnetically suppressed Faraday system is disclosed in U.S. Pat. No. 5,757,018 issued May 26, 1998 to Mack et al. In another prior art approach to inhibiting escape of electrons, the depth of the Faraday cup is made large in comparison with the width of its entrance aperture, so that electrons generated at the bottom of the Faraday cup have a relatively small probability of escaping through the entrance aperture.

Ion implanters are typically required to operate over a wide energy range. In particular, ion implanters are increasingly required to operate at low energies due to process requirements for shallow and ultra-shallow junctions. At low energies, the ion beam diameter increases significantly due to the well-known space charge effect. In order to perform accurate dose measurements at low ion energies, Faraday cups with large entrance apertures are therefore required. Since space considerations in the ion implanter may prevent a corresponding increase in the depth of the Faraday cup, the Faraday cup may have a relatively large entrance aperture width in comparison to the cup depth. This exacerbates the problem of secondary electron escape and results in reduced measurement accuracy.

Accordingly, there is a need for improved methods and apparatus for measuring ion beam current, particularly at low energies.

SUMMARY OF THE INVENTION

According to a first aspect of the invention, a Faraday system is provided for use in an ion beam treatment system. The Faraday system comprises a Faraday cup body defining a chamber which has an entrance aperture for receiving an ion beam, a suppression electrode positioned in proximity to the entrance aperture to produce electric fields for inhibiting escape of electrons from the chamber, and a magnet assembly positioned to produce magnetic fields for inhibiting escape of electrons from the chamber.

In one embodiment, the ratio of chamber depth to entrance aperture width is less than 2.0. In another embodiment, the ratio of chamber depth to entrance aperture width is less than 1.0.

The magnet assembly may comprise first and second magnets disposed on opposite sides of the Faraday cup body.

The suppression electrode may comprise a suppression ring disposed around the entrance aperture. The suppression ring may have an aperture that is larger in width than the entrance aperture. The suppression ring may be tapered toward the aperture in the suppression ring. The Faraday system may further comprise a suppression power supply for biasing the suppression electrode at a suppression voltage relative to the Faraday cup body.

In other embodiments, all or part of an interior surface of the Faraday cup body is coated with a material that exhibits relatively low electron emission. In one example, the interior surface of the Faraday cup body has a carbon coating. In other embodiments, the Faraday cup body is fabricated of graphite.

In other embodiments, the Faraday cup body includes a grid of holes facing the entrance aperture. The grid of holes may be located at the bottom of the Faraday cup opposite the entrance aperture.

BRIEF DESCRIPTION OF THE DRAWINGS

For a better understanding of the present invention, reference is made to the accompanying drawings, which are incorporated herein by reference and in which:

FIG. 3A is a front elevation view of a Faraday system in accordance with an embodiment of the invention;

FIG. 3B is a cross-sectional view of the Faraday system taken along the line 3B—3B of FIG. 3A;

FIG. 3C is a cross-sectional view of the Faraday system taken along the line 3C—3C of FIG. 3A;

FIG. 3D is a cross-sectional view of the Faraday system taken along the line 3D—3D of FIG. 3B; and FIG. 3E is an enlarged fragmentary view of the entrance aperture and the suppression electrode.

DETAILED DESCRIPTION

Figure 1:
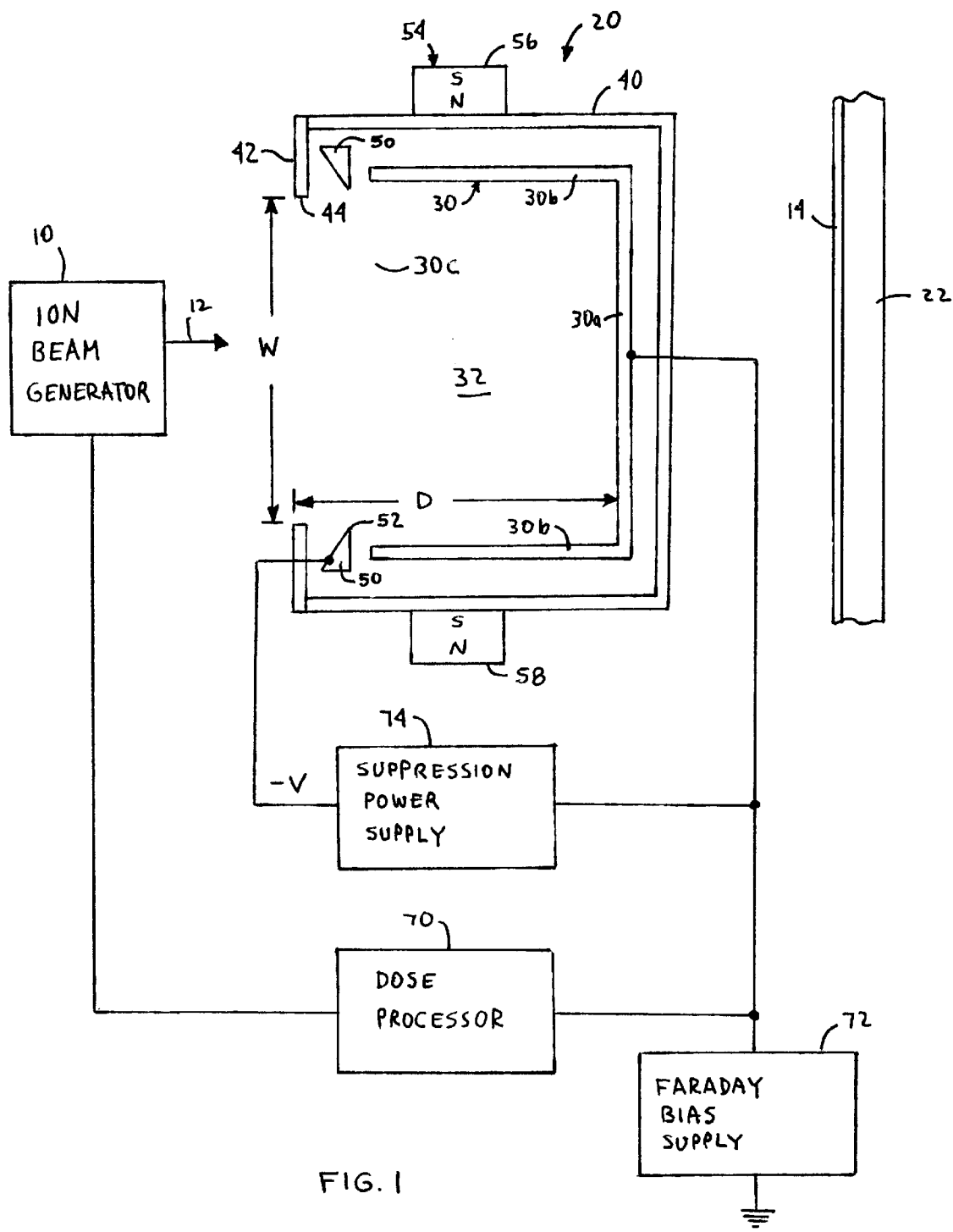
FIG. 1 is a schematic block diagram of an ion implanter incorporating a Faraday system in accordance with an embodiment of the invention.

A simplified schematic diagram of an ion implanter incorporating a Faraday system in accordance with an embodiment of the invention is shown in FIG. 1. An ion beam generator 10 directs an ion beam 12 at a workpiece, typically a semiconductor wafer 14. Wafer 14 may be mounted on a platen 22 in an end station (not shown), which may include wafer handling equipment for loading wafers into the system for ion implantation and for unloading wafers from the system following ion implantation.

The ion beam generator 10 typically includes an ion source, including electrodes for forming a well-defined ion beam, a mass analyzer for removing undesired species from the ion beam and an accelerator for accelerating ions in the ion beam to desired energies. The ion beam generator 10 may also include ion optical elements for focusing the ion beam and a beam scanner for scanning the beam in one or more directions.

A variety of different ion implanter configurations are known to those of skill in the art. The wafer 14 may be mounted on any suitable wafer support device. The ion beam 12 may be distributed over the wafer surface by beam scanning, by mechanical movement of wafer 14 or by a combination of beam scanning and wafer movement. The entire region between the ion source and wafer 14 is evacuated during operation of the ion implanter.

A Faraday system 20 is used for measurement of ion beam 12 current. In the example of FIG. 1, Faraday system 20 is moved into the path of the ion beam 12 before or after an ion implant for measurement of the ion beam current. The Faraday system 20 may have a fixed position or may be movable. The Faraday system may be moved continuously or in steps to measure the uniformity of a scanned ion beam or a ribbon ion beam. In other embodiments, the Faraday system may be moved into the path of an unscanned ion beam for measuring ion beam current. In further embodiments, the Faraday system 20 is positioned adjacent to semiconductor wafer 14, and ion beam 12 is deflected to Faraday system 20 at intervals during ion implantation of semiconductor wafer 14.

The Faraday system 20 includes a Faraday cup body 30 which defines a chamber 32 for receiving ion beam 12. Faraday cup body 30 is electrically conductive and includes an end wall 30a, side walls 30b and an open side 30c. In one example, Faraday cup body 30 is fabricated of aluminum and has a generally rectangular shape. Faraday system 20 may further include a housing 40 that encloses Faraday cup body 30. Housing 40 may include a front plate 42 having an opening that defines an entrance aperture 44 of chamber 32. In other embodiments, the entrance aperture may be defined by Faraday cup body 30. Faraday system 20 further includes a suppression electrode 50 positioned in proximity to entrance aperture 44 and a magnet assembly 54 which produces magnetic fields in chamber 32 for inhibiting escape of electrons from chamber 32.

Faraday cup body 30 may be connected to a dose processor 70. The dose processor 70 receives from Faraday system 20 an electrical current that is representative of the ion beam current received through entrance aperture 44. As known in the art, dose processor 70 integrates the current with respect to time to determine total ion dose implanted in semiconductor wafer 14. The dose processor 70 can be used to control ion beam generator 10. In one example, the scan waveform can be adjusted to achieve a desired dose uniformity. In another example, ion implantation of wafer 14 can be terminated when a predetermined ion dose is reached. In one embodiment, dose processor 70 is implemented as a general purpose computer that is programmed for controlling dose and dose uniformity of implanted wafers. In other embodiments, dose processor 70 may be a special purpose controller or a local controller that is partially or fully dedicated to dose measurement and control.

As noted above, Faraday cup body 30 is electrically connected to dose processor 70 and may be connected to a Faraday bias supply 72 which permits cup body 30 to be biased at a desired potential. Housing 40 is preferably connected to a reference potential, such as ground, and is electrically isolated from Faraday cup body 30. Suppression electrode 50 may be connected to a suppression power supply 74 which supplies a bias voltage to suppression electrode 50. Typically, suppression electrode 50 is biased negatively with respect to Faraday cup body 30. Suppression electrode 50 is electrically isolated from Faraday cup body 30 and housing 40.

As noted above, the ion implanter is typically required to operate with a variety of different ion species, ion energies and ion currents. The ion implanter may be required to operate over a wide energy range, such as for example 10 keV to 3 MeV. Over this range of operating conditions, the cross-sectional dimensions of the ion beam vary widely. In particular, at low energies, the ion beam may have a relatively large cross-sectional dimension. In order to provide accurate measurements of ion beam current over the range of operating conditions, all or most of the ion beam should be intercepted by Faraday system 20. Accordingly, the width W of entrance aperture 44 of chamber 32 must be large enough to pass the largest expected ion beam. In one example, entrance aperture 44 has dimensions of 2.010 inches by 2.385 inches (in.) to accept ion beams having energies over a range of 10 keV to 2 MeV. If a portion of the ion beam is not intercepted by Faraday system 20, the measured beam current is less than the actual beam current delivered to the wafer, and an overdose of the wafer may result.

When energetic ions enter Faraday cup body 30 and impinge on surfaces within Faraday cup body 30, secondary electrons are generated. The secondary electrons may impinge on surfaces within Faraday cup body 30 and generate tertiary electrons. Escape of secondary and tertiary electrons from the Faraday cup body 30 causes a measurement error. The ease with which electrons can escape from Faraday system 20 depends in part on the ratio of the width W of entrance aperture 44 to the depth D of chamber 32. In particular, it is less likely that electrons will escape from a relatively deep Faraday cup because the electrons are more likely to be incident on the sidewalls than to pass through the entrance aperture. Conversely, electrons escape from the Faraday cup with relative ease in the case of a relatively shallow chamber. To alleviate this problem, it is known to construct Faraday cups having a relatively large ratio of chamber depth to entrance aperture width. Unfortunately, space is very limited in most ion implanters. Thus, as the entrance aperture width is increased to accommodate larger ion beams, it may not be practical to make a corresponding increase in the depth of the Faraday cup. In one example, entrance aperture 44 has dimensions of 2.010 in.×2.385 in., and chamber 32 has a depth D of 2.373 in. The requirement to measure a relatively large diameter ion beam and the limited space in the ion implanter may dictate a ratio of chamber depth to entrance aperture width less than 2.0 and in some cases may dictate a ratio of chamber depth to entrance aperture width less than 1.0.

In order to inhibit the escape of secondary and tertiary electrons from a Faraday cup having a relatively small ratio of chamber depth to entrance aperture width, suppression electrode 50 and magnet assembly 54 may be utilized. Suppression electrode 50 is positioned in proximity to entrance aperture 44 and produces electric fields which inhibit escape of electrons from chamber 32. Magnet assembly 54 produces in chamber 32 magnetic fields which inhibit escape of electrons from chamber 32.

In one embodiment, suppression electrode 50 is configured as a ring having an aperture 52 that is slightly larger than entrance aperture 44 and which is tapered inwardly to an edge at aperture 52. Suppression electrode 50 is configured to produce electric fields which inhibit the escape of electrons from chamber 32. Suppression electrode 50 is shaped to present a small area for impact by secondary and tertiary electrons, thereby limiting the generation of additional electrons from suppression electrode 50. Preferably, suppression electrode 50 is biased at a voltage in a range of about −200 volts to −1000 volts by suppression power supply 74.

In the embodiment of FIG. 1, magnet assembly 54 includes a first magnet 56 and a second magnet 58 mounted on opposite sides of housing 40. Magnet assembly 54 is preferably configured such that first magnet 56 and second magnet 58 have opposite poles facing chamber 32. The magnetic fields generated by magnets 56 and 58 further inhibit escape of secondary and tertiary electrons from chamber 32. In a preferred embodiment, magnets 56 and 58 generate magnetic fields on the order of greater than 500 gauss. It will be understood that different configurations of magnet assembly 54 may be utilized within the scope of the invention. The magnetic field strength and the position of magnet assembly 54 depend on the required suppression of secondary and tertiary electrons.

An example of an implementation of Faraday system 20 is shown in FIGS. 3A–3E. Like elements in FIGS. 1 and 3A–3E have the same reference numerals. As shown, suppression electrode 50 is mounted to a support element 110. Magnets 56 and 58 are enclosed by covers 112 and 114, respectively. A mounting bracket 120 is used for mounting Faraday system 20 to the structure of the ion implanter. As illustrated in FIG. 3E, front plate 42 may be tapered inwardly to an edge at entrance aperture 44, and suppression electrode 50 may be tapered inwardly to an edge at aperture 52.

In one specific example, Faraday cup body 30 had a width of 2.090 in., a length of 2.465 in. and a depth of 1.610 in. Entrance aperture 44 had a width of 2.010 in. and a length of 2.385 in. Suppression electrode 50 had a tapered edge and was biased at −500 volts relative to Faraday cup body 30. Aperture 52 in suppression electrode 50 had a width of 2.090 in. and a length of 2.465 in. Magnets 56 and 58 were permanent magnets and were mounted on opposite sides of housing 40. It will be understood that these parameters are given by way of example only and are not limiting as to the scope of the invention.

Figure 2:
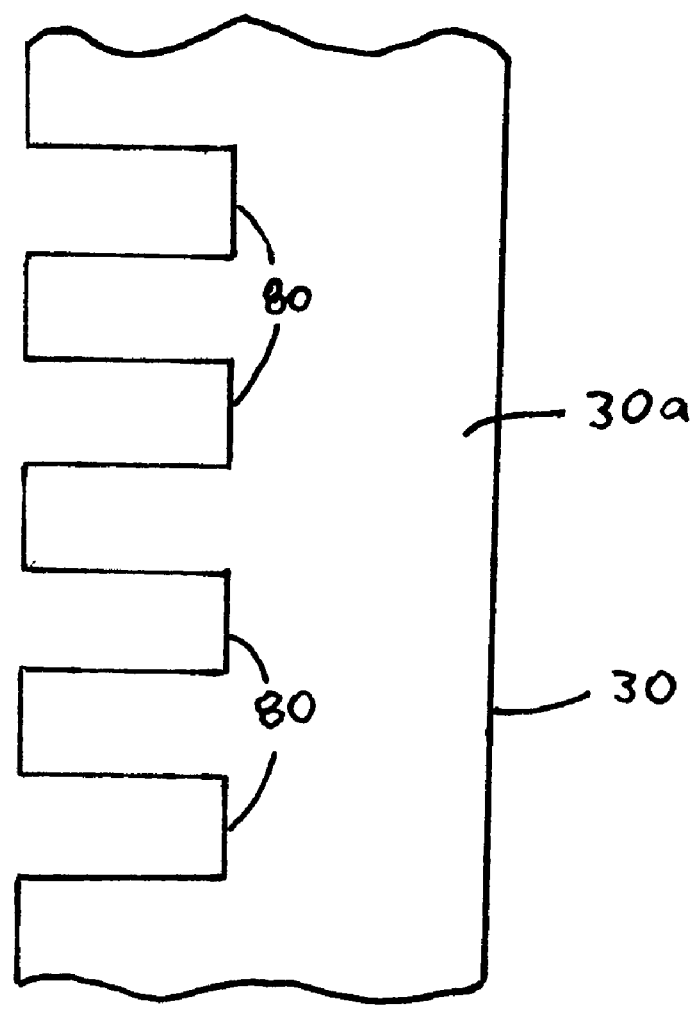
FIG. 2 is a partial cross-sectional view of a Faraday cup end wall in accordance with another embodiment of the invention.

According to another aspect of the invention, escape of electrons through entrance aperture 44 can be inhibited by providing a plurality of holes on one or more inside surfaces of Faraday cup body 30. As shown in FIG. 2, end wall 30a of Faraday cup body 30 is provided with a plurality of holes 80 facing entrance aperture 44. Holes 80 have widths and depths selected to inhibit escape of secondary electrons. In particular, secondary electrons generated at the ends of holes 80 have a reduced probability of escaping from holes 80 as compared with secondary electron emission from a flat surface. The dimensions of holes 80 are selected to suppress secondary electron emission. Holes 80 may be round, square, rectangular, elongated, etc. The holes may be arranged in a regular pattern, such as a two-dimensional array or grid, or may be positioned randomly. In one embodiment, holes 80 have widths of 0.25 in.×0.25 in. and depths of 0.25 in. In another embodiment, a grid having holes, or openings, dimensioned as described above is mounted on end wall 30a of Faraday cup body 30. The holes in the grid may be spaced by 1 millimeter, for example.

According to a further aspect of the invention, escape of electrons through entrance aperture 44 is inhibited by suppressing generation of secondary and tertiary electrons. In particular, all or part of the inside surface of Faraday cup body 30 is coated with a material that exhibits relatively low secondary electron emission. For example, end wall 30a of Faraday cup body 30 may be coated with carbon in the form of graphite. Other suitable materials that exhibit relatively low secondary electron emission include, but are not limited to, boron nitride. In yet another approach, the Faraday cup body 30 is fabricated of a material that exhibits relatively low secondary electron emission. For example, Faraday cup body 30 may be fabricated of graphite.

A number of techniques for inhibiting escape of electrons through entrance aperture 34 have been described. The techniques may be utilized separately or in combination, depending on the Faraday cup form factor and the required measurement accuracy. In a preferred embodiment, suppression electrode 50 and magnet assembly 54 are utilized together to achieve good measurement accuracy over a range of ion energies.

The Faraday system of the invention is not limited to use in ion implanters. In general, the Faraday system may be used in any ion beam treatment system to measure ion beam current.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A Faraday system for use in an ion beam treatment system, comprising:
    a Faraday cup body defining a chamber, said chamber having a defined depth and an entrance aperture for receiving an ion beam wherein an aspect ratio of said chamber depth and said entrance aperture is less than approximately 1.0;
    a suppression electrode positioned in proximity to the entrance aperture to produce electric fields for inhibiting escape of electrons from said chamber; and
    a magnet assembly positioned to produce magnetic fields for inhibiting escape of electrons from said chamber.

2. A Faraday system as defined in claim 1 wherein said magnet assembly comprises first and second magnets disposed on opposite sides of said Faraday cup body.

3. A Faraday system as defined in claim 1 wherein said suppression electrode comprises a suppression ring disposed around said entrance aperture.

4. A Faraday system as defined in claim 3 further comprising a suppression power supply for biasing said suppression electrode at a suppression voltage relative to said Faraday cup body.

5. A Faraday system as defined in claim 3 wherein said suppression ring has an aperture that is larger than said entrance aperture.

6. A Faraday system as defined in claim 3 wherein said suppression ring has an aperture and wherein said suppression ring is tapered toward the aperture in said suppression ring.

7. A Faraday system as defined in claim 1 wherein all or part of an interior surface of said Faraday cup body is coated with a material that exhibits relatively low secondary electron emission.

8. A Faraday system as defined in claim 1 wherein all or part of a interior surface of said Faraday cup body has a carbon coating.

9. A Faraday system as defined in claim 1 wherein said Faraday cup body is fabricated of graphite.

10. A Faraday system as defined in claim 1 wherein said Faraday cup body includes a plurality of holes facing said entrance aperture.

11. A Faraday system as defined in claim 1 further comprising a housing enclosing said Faraday cup body, said housing including a front plate having an opening which defines the entrance aperture of said chamber.

12. A Faraday system for use in an ion beam treatment system, comprising:
    a Faraday cup body defining a chamber having an open side and a defined chamber depth; and
    a plate positioned in front of said open side, said plate having an opening that defines an entrance aperture of said chamber, wherein an aspect ratio of said chamber depth to entrance aperture width is less than approximately 1.0.

13. A Faraday system for use in an ion beam treatment system, comprising:
    a Faraday cup body defining a chamber having an open side and a defined chamber depth; and
    a plate positioned in front of said open side, said plate having an opening that defines an entrance aperture for said chamber so that an aspect ratio of said chamber depth and said entrance aperture is less than approximately 1.0, wherein at least a portion of an inside surface of said Faraday cup body includes a plurality of holes facing said chamber.

14. A Faraday system as defined in claim 13 wherein said plurality of holes comprises a pattern of holes on an end wall of said Faraday cup body facing said entrance aperture.

15. A method for measuring ion current in an ion beam treatment system, comprising steps of:
    providing a Faraday cup body which defines a chamber, said chamber having an entrance aperture and a defined chamber depth for receiving an ion beam wherein an aspect ratio of said chamber depth and said entrance aperture is less than approximately 1.0;
    positioning a suppression electrode in proximity to the entrance aperture to produce electric fields for inhibiting escape of electrons from said chamber; and
    positioning a magnet assembly to produce magnetic fields for inhibiting escape of electrons from said chamber.

16. A Faraday system for use in an ion beam treatment system, comprising:
    a Faraday cup body defining a chamber, said chamber having an entrance aperture for receiving an ion beam;
    a suppression electrode positioned in proximity to the entrance aperture to produce electric fields for inhibiting escape of electrons from said chamber wherein said suppression electrode comprises a suppression ring disposed around said entrance aperture and wherein said suppression electrode has an aperture and said suppression ring is tapered toward the aperture in said suppression ring; and
    a magnet assembly positioned to produce magnetic fields for inhibiting escape of electrons from said chamber.

17. A method for measuring ion current in an ion beam treatment system, comprising steps of:
    providing a Faraday cup body which defines a chamber, said chamber having an entrance aperture for receiving an ion beam;
    positioning a suppression electrode in proximity to the entrance aperture to produce electric fields for inhibiting escape of electrons from said chamber wherein said suppression electrode comprises a suppression ring disposed around said entrance aperture and wherein said suppression ring has an aperture and said suppression ring is tapered toward the aperture in said suppression ring; and
    positioning a magnet assembly to produce magnetic fields for inhibiting escape of electrons from said chamber.

* * * * *